United States Patent
Lee et al.

(10) Patent No.: US 7,397,656 B2
(45) Date of Patent: Jul. 8, 2008

(54) FLAT DISPLAY PANEL SUPPORT AND FLAT PANEL DISPLAY DEVICE INCLUDING THE SUPPORT

(75) Inventors: Sun-Youl Lee, Suwon-si (KR); Jong-Jin Kim, Suwon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 324 days.

(21) Appl. No.: 11/255,886

(22) Filed: Oct. 24, 2005

(65) Prior Publication Data

US 2006/0109614 A1    May 25, 2006

(30) Foreign Application Priority Data

Nov. 18, 2004    (KR) .................. 10-2004-0094508

(51) Int. Cl.
    *H05K 7/14*    (2006.01)
(52) U.S. Cl. .................................. 361/681; 312/223.2
(58) Field of Classification Search ................ 361/681, 361/682; 349/60, 59; 312/223.2
    See application file for complete search history.

(56) References Cited

U.S. PATENT DOCUMENTS

| | | | |
|---|---|---|---|
| 6,795,135 B1 * | 9/2004 | Moon | 349/61 |
| 6,867,827 B2 * | 3/2005 | Cha et al. | 349/65 |
| 6,879,308 B2 * | 4/2005 | Hsieh et al. | 345/87 |
| 6,900,792 B2 * | 5/2005 | Sun et al. | 345/156 |
| 6,929,392 B2 * | 8/2005 | Kim et al. | 362/632 |
| 2005/0057149 A1 * | 3/2005 | Herranen et al. | 313/504 |

FOREIGN PATENT DOCUMENTS

| | | |
|---|---|---|
| JP | 10-312159 | 11/1998 |
| JP | 2000-029005 | 1/2000 |
| JP | 2000-29005 | 1/2000 |
| JP | 2002-090710 | 3/2002 |
| JP | 2003-298700 | 10/2003 |
| JP | 2004-258280 | 9/2004 |
| KR | 1020040063614 | 7/2004 |
| WO | WO 2004/077386 | 9/2004 |

OTHER PUBLICATIONS

Korean Office Action for Korean Patent Application No. 2004-0094508 issued on Aug. 24, 2006.
European Office Action of the European Patent Application No. 05 11 0795, mailed on Feb. 1, 2006.

* cited by examiner

*Primary Examiner*—Jayprakash N Gandhi
*Assistant Examiner*—Ingrid Wright
(74) *Attorney, Agent, or Firm*—Robert E. Bushnell, Esq.

(57) ABSTRACT

An apparatus for supporting a two-sided emission Organic Electroluminescent Display (OELD) panel having a display element includes: a first support member having a first groove and supporting one side of four sides of the flat display panel; and a pair of second support members each having a second groove and supporting opposite sides excluding the one side of the four sides of the flat display panel. A side opposite to the one side of the four sides of the flat display panel is exposed, and the flat display panel is arranged in the first groove of the first support member and the second grooves of the pair of second support members and is supported by the first support member and the pair of second support members.

22 Claims, 4 Drawing Sheets

FLAT DISPLAY PANEL SUPPORT AND FLAT PANEL DISPLAY DEVICE INCLUDING THE SUPPORT

CLAIM OF PRIORITY

This application makes reference to, incorporates the same herein, and claims all benefits accruing under 35 U.S.C.§119 from an application for APPARATUS FOR SUPPORTING FLAT DISPLAY PANEL AND FLAT PANEL DISPLAY DEVICE HAVING THE SAME earlier filed in the Korean Intellectual Property Office on 18 Nov. 2004 and there duly assigned Ser. No. 10-2004-0094508.

BACKGROUND OF THE INVENTION

1. Field of the Invention

The present invention relates to a flat panel display device, and more particularly, to a two-sided emission Organic ElectroLuminescent Display (OELD) panel support and to an OELD device including the support.

2. Description of the Related Art

In general, flat panel display devices such as OELD devices or Liquid Crystal Display (LCD) devices include a flat display panel for implementing an image, a driving circuit for driving the flat display panel, and a Flexible Printed Circuit (FPC) for connecting the driving circuit to the flat display panel.

The flat display panel includes a substrate on which a display element is arranged in an image display unit, an encapsulation substrate arranged to face the substrate and encapsulating the display element, and a sealing member such as a sealant for sealing the substrate and the encapsulation substrate.

The substrate is generally a glass substrate, a plastic substrate, or a metallic substrate, and a support member for supporting the substrate is needed.

Korean Laid-open Patent Publication No. 2004-0063614 discloses a support structure for supporting a liquid crystal module used as a flat panel display device, that is, a support structure for supporting different types of liquid crystal modules using one bracket.

In general, an OELD device is a self-emission device which includes upper and lower electrodes and an emission layer interposed between the upper and lower electrodes and in which light is emitted from the emission layer according to voltages supplied to the upper and lower electrodes, thereby displaying an image.

Electroluminescent display devices are classified as inorganic electroluminescent display devices, in which an emission layer interposed between the upper and lower electrodes is formed of an inorganic material, and OELD devices, in which an emission layer interposed between the upper and lower electrodes is formed of an organic material. The OELD devices have excellent characteristics such as wide view-angle, fast response speed and high contrast and thus, are considered to be the next-generation of flat panel display devices.

OELD devices are classified as high molecular OELD devices in which an emission layer is formed of a high molecular material, and low molecular OELD devices in which an emission layer is formed of a low molecular material, according to organic materials.

OELDs are also classified according to a path on which light is emitted from the emission layer including: a rear emission OELD device in which light is emitted from an emission layer in a direction of a substrate, a front emission OELD device in which light is emitted from an emission layer toward an encapsulation substrate which is in an opposite direction to the substrate, and a two-sided emission OELD device in which light is emitted from an emission layer towards both a substrate and an encapsulation substrate.

In the two-sided emission OELD device, since light is emitted from the emission layer towards both the substrate and the encapsulation substrate, an OELD panel support is needed that does not interfere with an emission path of light emitted from the emission layer.

SUMMARY OF THE INVENTION

The present invention provides a two-sided emission flat display panel support and a two-sided emission flat panel display device including the support.

According to one aspect of the present invention, an apparatus to support a flat display panel having a display element is provided, the apparatus including: a first support member having a first groove and adapted to support one of four sides of the flat display panel; and a pair of second support members each having a second groove and adapted to support opposite sides excluding the one side of the four sides of the flat display panel; a side opposite to the one side of the four sides of the flat display panel is exposed, and the flat display panel is arranged in the first groove of the first support member and the second grooves of the pair of second support members and supported by the first support member and the pair of second support members.

The first support member and the pair of second support members each preferably include a thin metallic plate material. The first support member and the pair of second support members are preferably separate from one another. The first support member and the pair of second support members alternatively preferably include a unitary body. The first support member and the pair of second support members preferably support the flat display panel to expose portions of the flat display panel corresponding to the display element of top and bottom surfaces of the flat display panel.

The flat display panel preferably includes a two-sided emission Organic Electroluminescent Display (OELD) panel.

According to another aspect of the present invention, a flat panel display device is provided including: a display panel including a substrate having an image display unit, a display element arranged on the image display unit of the substrate, and an encapsulation unit adapted to encapsulate the display element; and a support member adapted to support the display panel, the support member including: a first support member having a first groove and adapted to support one side of four sides of the flat display panel; and a pair of second support members each having a second groove and adapted to support opposite sides excluding the one side of the four sides of the flat display panel; a side opposite to the one side of the four sides of the flat display panel is exposed and the flat display panel is arranged in the first groove of the first support member and the second grooves of the pair of second support members.

The first support member and the pair of second support members each preferably include a thin metallic plate material. The first support member and the pair of second support members are preferably separate from one another. The first support member and the pair of second support members alternatively preferably include a unitary body. The first support member and the pair of second support members preferably support the flat display panel to expose portions corresponding to the display element of top and bottom surfaces of the flat display panel.

The display panel is preferably a two-sided emission Organic Electroluminescent Display (OELD) panel.

According to still another aspect of the present invention, an apparatus to support a flat display panel having a display element is provided, the apparatus including: a first support member and a second support member, at least one of the first and second support members including a concave portion, the first and second support members being separate from each other and then combined with each other to support the flat display panel; a side opposite to the one side of four sides of the flat display panel is exposed, the concave portion is a groove defined by combining the first support member and the second support member, and the flat display panel is arranged in the groove.

The first and second support members each preferably comprise a thin metallic plate material.

The concave portion is preferably arranged in the first support member to support a bottom surface of the flat display panel. The concave portion is alternatively preferably arranged in the second support member to support a top surface of the flat display panel. The concave portion is alternatively preferably arranged in each of the first and second support members.

The flat display panel is preferably supported by the first and second support members to expose portions corresponding to the display element of top and bottom surfaces of the flat display panel. The flat display panel preferably includes a two-sided emission Organic Electroluminescent Display (OELD) panel.

According to yet another aspect of the present invention, a flat panel display device is provided including: a flat display panel including a substrate having an image display unit, a display element arranged on the image display unit of the substrate, and an encapsulation unit adapted to encapsulate the display element; and a first support member and a second support member, at least one of the first and second support members including a concave portion, a side opposite to one side of four sides of the flat display panel being exposed, the first and second support members being separate from each other and then combined to support the flat display panel; the concave portion is a groove defined by combining the first and second support members above and below, and the flat display panel is arranged in the groove.

The first and second support members each preferably comprise a thin metallic plate material.

The concave portion is preferably arranged in the first support member to support a bottom surface of the flat display panel. The concave portion is alternatively preferably arranged in the second support member to support a top surface of the flat display panel. The concave portion is alternatively preferably arranged in each of the first and second support members.

The flat display panel is preferably supported by the first and second support members to expose portions corresponding to the display element of top and bottom surfaces of the flat display panel. The flat display panel preferably includes a two-sided emission Organic Electroluminescent Display (OELD) panel.

BRIEF DESCRIPTION OF THE DRAWINGS

The above and other aspects and advantages of the present invention will become more apparent by describing in detail exemplary embodiments thereof with reference to the attached drawings in which.

DETAILED DESCRIPTION OF THE INVENTION

Figure 1:
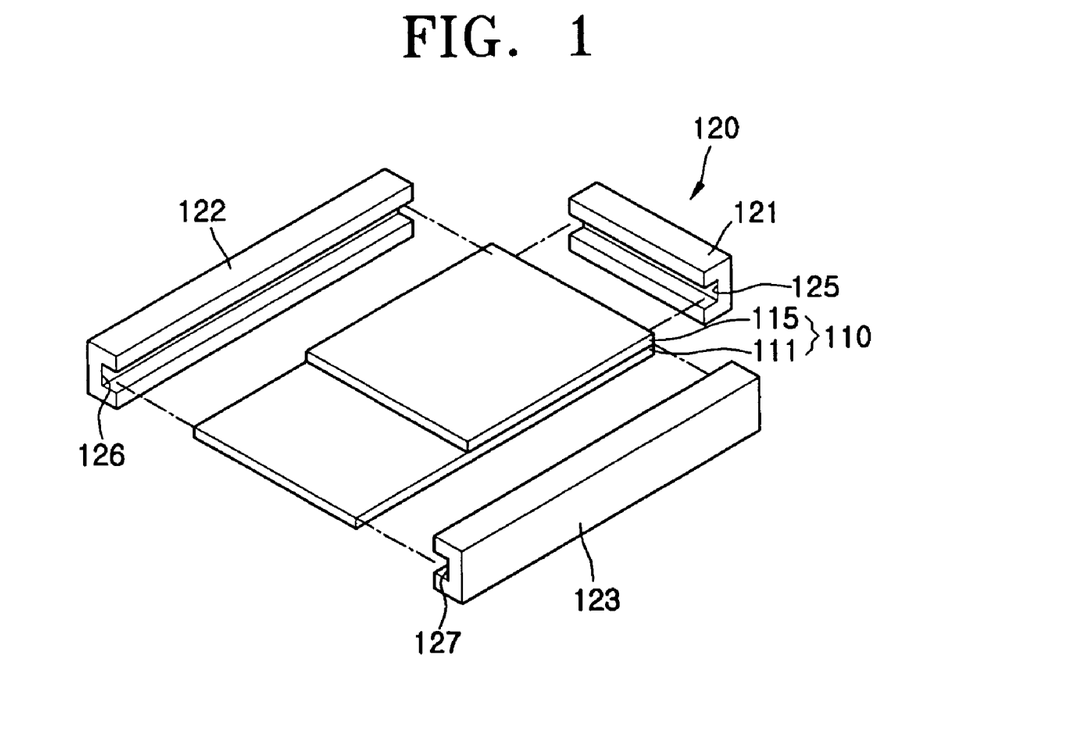
FIG. 1 is an exploded perspective view of a two-sided emission OELD device according to an embodiment of the present invention.

FIG. 1 is an exploded perspective view of a two-sided emission OELD device according to an embodiment of the present invention. The OELD device of FIG. 1 includes a two-sided emission organic ElectroLuminescent (EL) panel 110 and a support member 120 for supporting the two-sided emission organic EL panel 110.

The support member 120 includes a first support member 121 having a groove 125 and supporting one of the four sides of the organic EL panel 110 and a pair of second support members 122 and 123 each having grooves 126 and 127 and supporting opposite sides of the four sides of the organic EL panel 110. The first support member 121 and the pair of second support members 122 and 123 are separated from one another.

The support member 120 can be formed of a thin metallic plate. The support member 120 is not necessarily formed of a thin metallic plate and any material which can prevent breakage of the organic EL panel 110 and reinforce the strength of a panel in an organic EL module can be used for the support member 120.

The support member 120 has a structure in which the second support members 122 and 123 are combined with both sides of the first support member 121 so that another side facing the one side of the four sides of the organic EL panel 110 is exposed and portions of top and bottom surfaces of the organic EL panel 110 are exposed.

The organic EL panel 110 is inserted into the grooves 125, 126, and 127 of the support member 120, and an edge of the organic EL panel 110 is supported by the first support member 121 and the second support members 122 and 123 of the support member 120.

Figure 2:
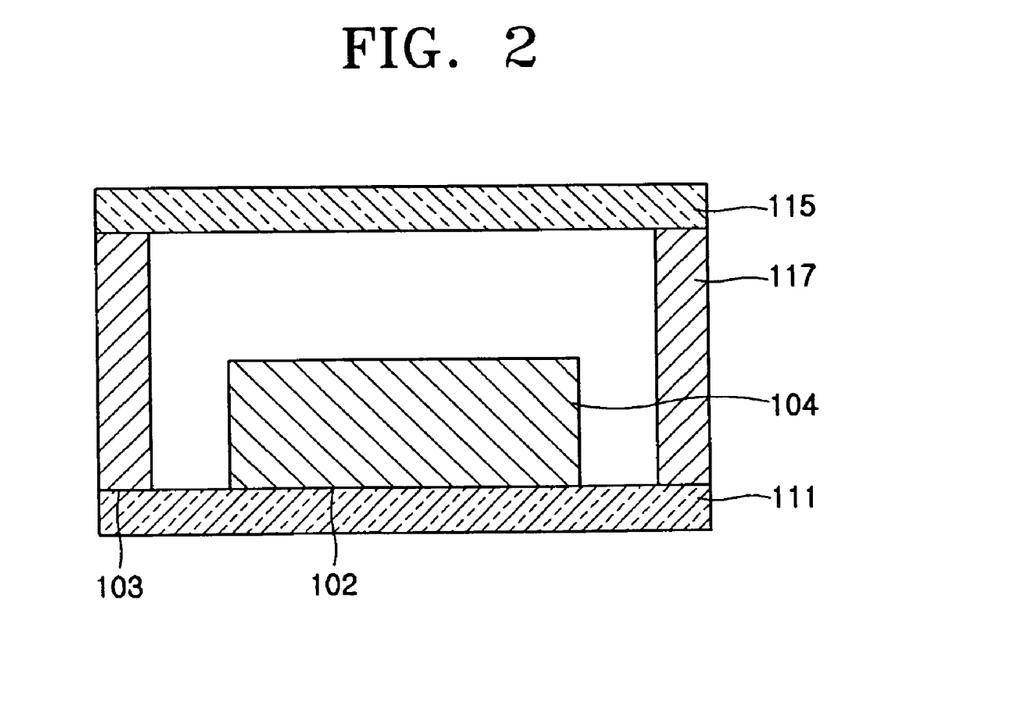
FIG. 2 is a cross-sectional view of a two-sided emission OELD device according to another embodiment of the present invention.

FIG. 2 is a cross-sectional view of the two-sided emission organic EL panel 110 according to another embodiment of the present invention. The two-sided emission organic EL panel 110 of FIG. 2 includes a substrate 111 on which a display element 104 is arranged, and an encapsulation unit 115. The substrate 111 includes an image display unit 102 and a non-image display unit 103. The encapsulation unit 115 is attached to the substrate 111 using a sealing member 117 such as a sealant, and encapsulates the display element 104.

The image display unit 102 is a unit in which the display element 104 is arranged to emit light and display an image. The non-image display unit 103 is an outer portion of the image display unit 102 in which pads (not shown) are arranged and on which the sealing member 117 to be attached to the encapsulation unit 115 is coated.

The display element 104 includes a plurality of pixels 101 arranged on the substrate 111 in a matrix shape. Each of the pixels 101 includes an organic ElectroLuminescent (EL) element and a Thin Film Transistor (TFT) and a capacitor which are driving elements for driving the organic EL element.

Figure 3:
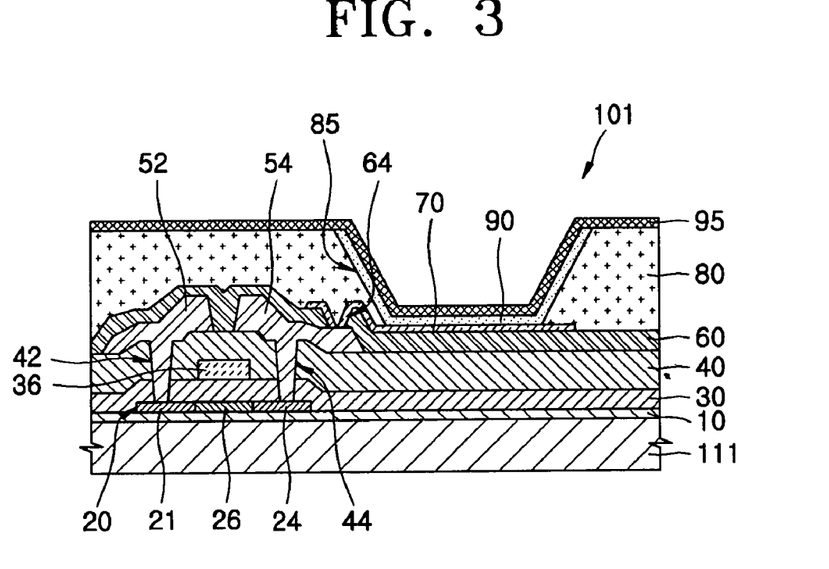
FIG. 3 is a cross-sectional view of one pixel of a two-sided emission OELD device according to another embodiment of the present invention

FIG. 3 is an example of a cross-sectional structure of an OELD device according to another embodiment of the present invention. FIG. 3 is a cross-sectional structure of one pixel 101 of the display element 104 of the OELD device, showing a cross-sectional view of an organic EL element and a driving TFT for driving the organic EL element.

Referring to FIG. 3, a TFT is formed on a buffer layer 10 of the substrate 111. The TFT includes a semiconductor layer 20, a gate 36, and source and drain electrodes 52 and 54.

The semiconductor layer 20 of the TFT is formed on the buffer layer 10 and includes source and drain regions 21 and 24 in which impurities of a predetermined conductivity type, for example, p-type impurities, are doped, and a channel region 26 between the source and drain regions 21 and 24 in which impurities are not doped.

The gate 36 is formed on a gate insulating layer 30 corresponding to the channel region 26 of the semiconductor layer 20. The source and drain electrodes 52 and 54 are formed on an InterLevel Dielectric (ILD) layer 40 and connected to the source and drain regions 21 and 24 via contact holes 42 and 44.

An organic EL element to be connected to the TFT is formed on a protective layer 60. The organic EL element includes an anode electrode 70, a cathode electrode 95, and an organic layer 90 interposed between the anode electrode 70 and the cathode electrode 95.

The anode electrode 70 is a lower electrode, formed on the protective layer 60 and connected to the drain electrode 54 of the source and drain electrodes 52 and 54 of the TFT through a via hole 64. A pixel isolation layer 80 having an opening 85 through which a part of the anode electrode 70 is exposed is formed on the substrate 11.

An organic layer 90 is formed on the anode electrode 70 in the opening 85, and the cathode electrode 95 is formed as an upper electrode on the substrate 111. The organic layer 90 includes at least one organic layer selected from a Hole Injection Layer (HIL), a Hole Transport Layer (HTL), an organic emission layer, an Electron Transport Layer (ETL), an Electron Injection Layer (EIL), and a Hole Blocking Layer (HBL).

Since the organic EL display device according to the present invention is a two-sided emission organic EL display device, the anode electrode 70 and the cathode electrode 95 can include a transparent electrode through which light emitted from an emission layer of the organic layer 90 is transmitted, and the substrate 111 and the encapsulation unit 115 can be formed of a transparent material.

In the organic EL display device according to the present invention, a cross-sectional structure of each pixel is not necessarily limited to the structure shown in FIG. 3 and can be a cross-sectional structure formed in a variety of shapes.

The TFT used in the OELD device according to the present invention includes an organic TFT in which a semiconductor layer includes an organic semiconductor layer, and a silicon TFT in which a semiconductor layer includes polycrystalline silicon or amorphous silicon. In addition, various types of substrates such a glass substrate and a plastic substrate and the like are used as the substrate.

In addition, in the OELD device according to the present invention, the organic EL element includes a high molecular organic electroluminescent element in which an organic layer includes a high molecular organic material, and a low molecular organic electroluminescent element in which an organic layer includes a low molecular organic material.

In the two-sided emission flat panel display device according to the embodiment of the present invention, only an edge of the organic EL panel 110 is supported by the support member 120 and a top surface of the organic EL panel 110, that is, a part of the encapsulation unit 115 and a bottom surface of the organic EL panel 110, that is, a part of the substrate 111 are exposed.

Since the organic EL panel 110 is a two-sided emission organic EL panel, the portion supported by the support member 120 can be the edge of the organic EL panel 110 corresponding to the non-image display unit 103, and portions of the substrate 111 and the encapsulation unit 115 of the organic EL panel 110 corresponding to the image display unit 102 can be exposed.

Thus, in the support member 120, a side of the organic EL panel 110 is inserted into each of the grooves 125 to 127. Thus, the width of the grooves 125 to 127 is determined by the thickness of the organic EL panel 110. In addition, the depth of the grooves 125 to 127 chosen so that only the edge of the organic EL panel 110 excluding the image display unit 102 which corresponds to the non-image display unit 103 is inserted into the grooves 125 to 127.

Although not shown, in the flat panel display device according to the present invention, a driving IC can be mounted on the substrate 111 of the organic EL panel 110. The driving IC is mounted using methods such as Chip-On-Glass (COG), wire bonding, Tape Automated Package (TAP), and the like.

Pads arranged on the substrate 111 of the organic EL panel 110 and padS of the driving IC are electrically connected to one another using an Anisotropic Conductive Film (ACF) so that a driving signal is supplied from the driving IC to the organic EL panel 110.

The COG method is a method by which an ACF (not shown) is attached to the lower substrate 111 of the organic EL panel 110, and a driving IC is attached to the ACF to mount it on the lower substrate 111.

The wire bonding method is a method by which pads of the organic EL panel 110 are connected to pads of the driving IC using a conductive wire, and the TAP method is a method by which the pads of the organic EL panel 110 and the pads of the driving IC are connected to one another using a base film.

In addition, the OELD device according to the present invention includes a flexible printed circuit (not shown) for supplying an external signal to the organic EL panel 100.

In the present invention, since the OELD device is a two-sided emission OELD device, unlike a rear emission or front emission OELD device in which a flexible printed circuit is bent and fixed at the support member 120, the flexible printed circuit can extend from the exposed side of the support member 120 and inserted into a main body.

For example, when the OELD device according to the present invention is used in a portable terminal such as a mobile phone, the flexible printed circuit extending from the exposed side of the support member 120 can be mounted in the main body in which a keypad is arranged.

The flexible printed circuit can be directly attached to the substrate 111 or thermally adhered to the substrate 111 using an ACF so as to precisely connect the organic EL panel 10 to the flexible printed circuit.

The pads of the flexible printed circuit are directly attached to the pads arranged on the substrate 111 of the organic EL panel 110 or attached using an ACF to be electrically connected to one another. When the driving IC is mounted on the substrate 111 of the organic EL panel 1110, the pads of the flexible printed circuit are electrically connected to the pads of the driving IC.

Figure 4:
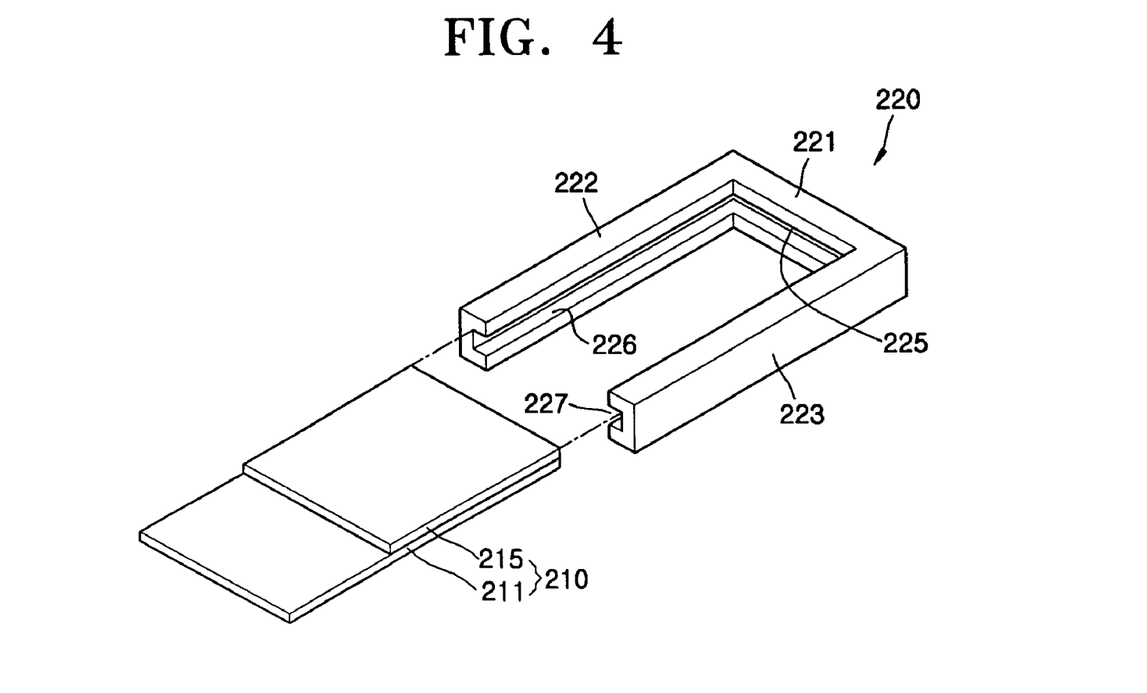
FIG. 4 is an exploded perspective view of a two-sided emission OELD device according to another embodiment of the present invention.

FIG. 4 is an exploded perspective view of a two-sided emission OELD device according to another embodiment of the present invention. The OELD device of FIG. 4 has the same structure as that of the OELD device of FIG. 1. There only difference is that the support member 220 of the organic EL panel of FIG. 4 is different from the support member 120 of FIG. 1.

The OELD device of FIG. 4 includes a two-sided emission organic EL panel 210 and a support member 220 for supporting the two-sided emission organic EL panel 210. The organic EL panel 210 has the same structure as that of the organic EL panel 110 of FIG. 2 or 3. In addition, the structure of the support member 220 is the same as that of the support member 120 of FIG. 1 and the only difference is that the support member 220 is formed in a monolithic shape.

That is, the support member 220 includes a first support member 221 having a groove 225 and supporting one side of four sides of the organic EL panel 210, and a pair of second support members 222 and 223 each having grooves 226 and 227 and supporting opposite sides excluding the one side of the four sides of the organic EL panel 210. The first support member 221 and the pair of second support members 222 and 223 are formed as a single body.

The support member 220 has a structure in which another side facing the one side of the four sides of the organic EL panel 210 is exposed and portions of top and bottom surfaces of the organic EL panel 210 are exposed.

The organic EL panel 210 is inserted into the grooves 225, 226, and 227 of the support member 220, and an edge of the organic EL panel 210 is supported by the first support member 221 and the second support members 222 and 223 of the support member 220.

In the two-sided emission flat panel display device according to the embodiment of the present invention, only the edge of the organic EL panel 210 is supported by the support member 220 so that a top surface of the organic EL panel 210, that is, a part of the encapsulation unit 215 and a bottom surface of the organic EL panel 210, that is, a part of the substrate 211 are exposed.

The support member 220 supports the edge of the organic EL panel 210 corresponding to the non-image display unit 103 and the substrate 211 and the encapsulation unit 215 of the organic EL panel 210 corresponding to the image display unit 102 is exposed.

Figure 5:
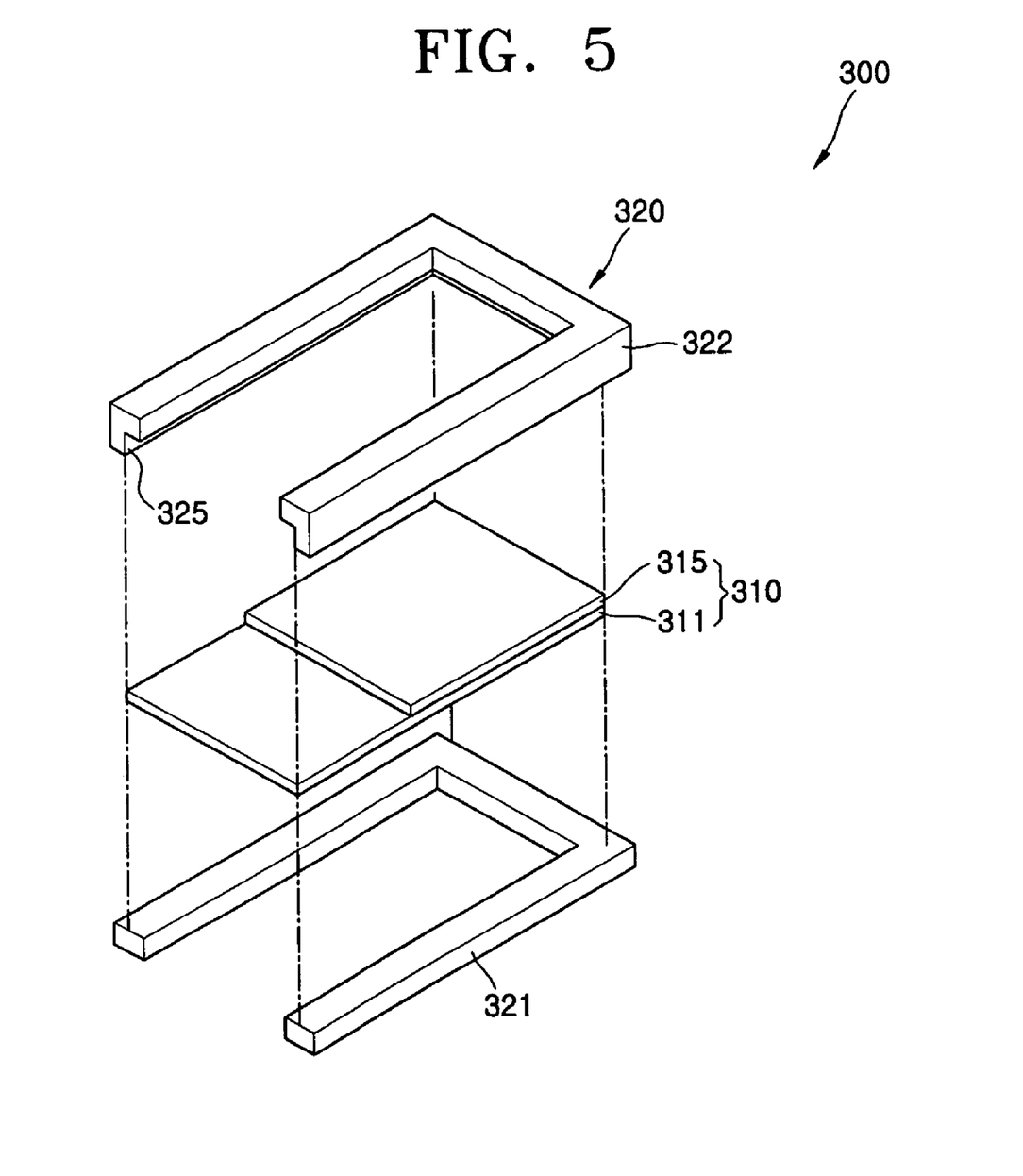
FIG. 5 is an exploded perspective view of a two-sided emission OELD device according to another embodiment of the present invention.

FIG. 5 is an exploded perspective view of a two-sided emission OELD device according to another embodiment of the present invention. The OELD device of FIG. 5 includes a two-sided emission organic EL panel 310 and a support member 320 for supporting the two-sided emission organic EL panel 310. The organic EL panel 310 has the same structure as that of the organic EL panel 110 of FIGS. 2 and 3.

The support member 320 includes a first support member 321 in which the organic EL panel 310 is mounted and which supports an edge of a bottom surface of the organic EL panel 310, and a second support member 322 which includes a concave portion 325 and supports sides and an edge of a top surface of the organic EL panel 310. The first support member 321 and the second support member 322 are separated from each other.

The first support member 321 and the second support member 322 are combined above and below, the concave portion 325 forms a groove, the organic EL panel 310 is inserted into the groove, and the first support member 321 and the second support member 322 support the organic EL panel 310. One side of the organic EL panel 310 is exposed and portions of top and bottom surfaces of the organic EL panel 310 are exposed.

The sides of the organic EL panel 310 are inserted into the groove formed by combining the first support member 321 and the second support member 322 of the support member 320 so that the width of the groove is determined by the thickness of the organic EL panel 310. In addition, the depth of the groove is chosen so that only the edge of the organic EL panel 310 excluding the image display unit 102 which corresponds to the non-image display unit 103 is inserted to the groove.

In another embodiment of the present invention, the concave portion 325 is formed in the second support member 322 so that the groove into which the organic EL panel 310 is to be inserted is formed when the second support member 322 is combined with the first support member 321. However, the present invention is not limited to this, and a concave portion can be formed only in the first support member 321 and a groove can be formed by combining the first support member 321 and the second support member 322.

In the two-sided emission flat panel display device according to the embodiment of the present invention, only the edge of the organic EL panel 310 is supported by the support member 320 so that a top surface of the organic EL panel 210, that is, a part of the encapsulation unit 315 and a bottom surface of the organic EL panel 310, that is, a part of the substrate 311 are exposed.

The support member 320 supports the edge of the organic EL panel 310 corresponding to the non-image display unit 103 and the substrate 311 and the encapsulation unit 315 of the organic EL panel 310 corresponding to the image display unit 102 may be exposed.

Figure 6:
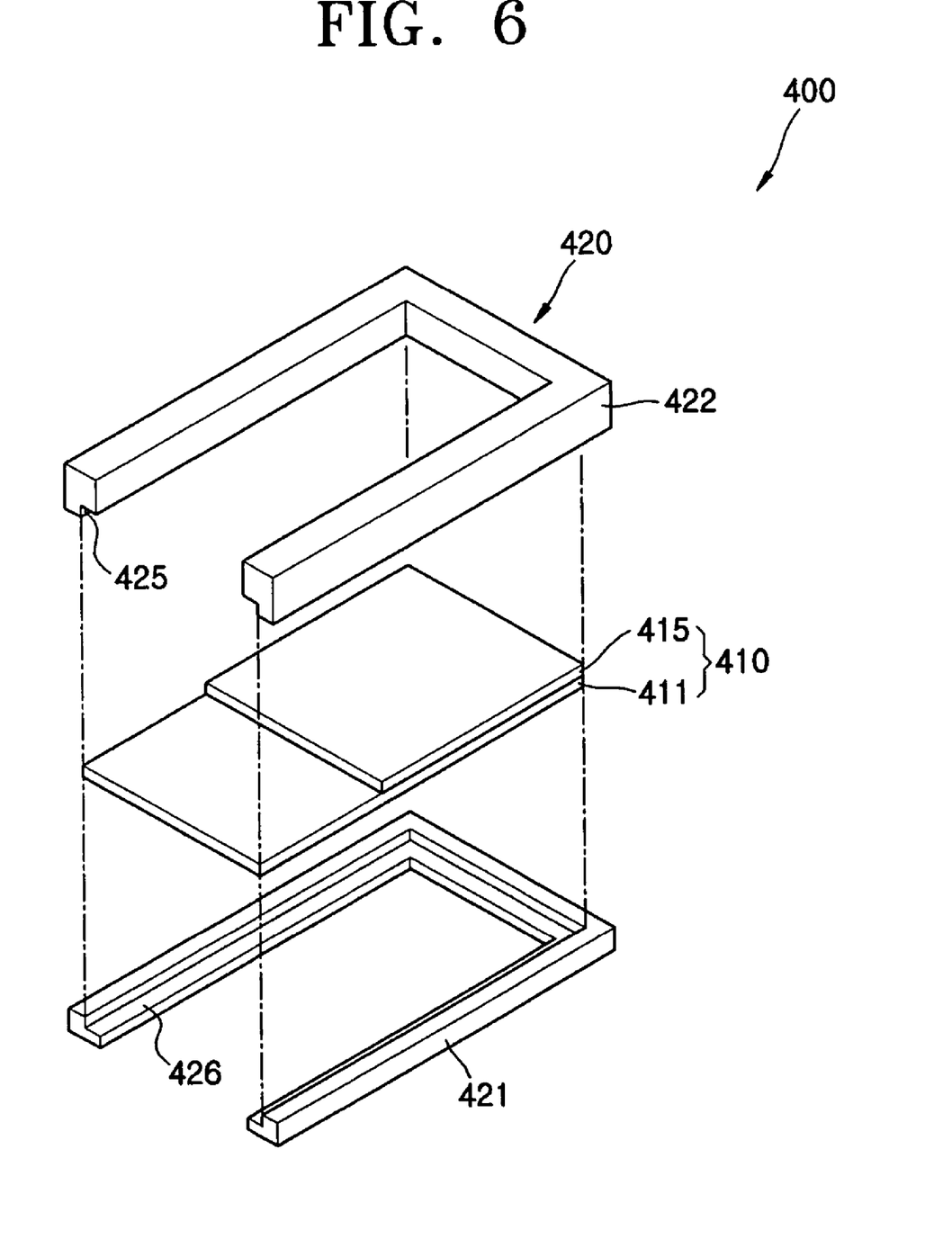
FIG. 6 is an exploded perspective view of a two-sided emission OELD device according to another embodiment of the present invention.

FIG. 6 is an exploded perspective view of a two-sided emission OELD device according to another embodiment of the present invention. The OELD device of FIG. 6 includes a two-sided emission organic EL panel 410 and a support member 420 for supporting the two-sided emission organic EL panel 410. The organic EL panel 410 has the same structure as that of the organic EL panel 110 of FIGS. 2 and 3.

The support member 420 includes a first support member 421 and a second support member 422 each having concave portions 425 and 426, and the first support member 421 and the second support member 422 are separated from each other.

The first support member 421 supports sides and an edge of a bottom surface of the organic EL panel 410 when the organic EL panel 410 is inserted into the concave portion 425, and the second support member 422 supports sides and an edge of a top surface of the organic EL panel 410 when the organic EL panel 410 is inserted into the concave portion 426.

The first support member 421 and the second support member 422 are combined with each other upward and downward, the concave portions 425 and 426 form a groove, the organic EL panel 410 is inserted into the groove, and the first support member 421 and the second support member 422 support the organic EL panel 410. One side of the organic EL panel 410 is exposed and portions of top and bottom surfaces of the organic EL panel 410 are exposed.

The sides of the organic EL panel 410 are inserted into the groove formed by combining the first support member 421 and the second support member 422 of the support member 420 so that the width of the groove is determined by the thickness of the organic EL panel 410. In addition, the depth of the groove is chosen so that only the edge of the organic EL panel 410 excluding the image display unit 102 which corresponds to the non-image display unit 103 is inserted to the groove.

In another embodiment of the present invention, the concave portions 425 and 426 having the same size and shape are formed in the first support member 421 and the second support member 422. However, the present invention is not limited to this, and the first support member 421 and the second support member 422 can be formed in different sizes or in different shapes so that a groove can be formed by combining the first support member 421 and the second support member 422.

In the two-sided emission flat panel display device according to the embodiment of the present invention, only the edge of the organic EL panel 410 is supported by the support member 420 so that a top surface of the organic EL panel 410, that is, a part of the encapsulation unit 415 and a bottom surface of the organic EL panel 410, that is, a part of the substrate 411 are exposed.

The support member 420 supports the edge of the organic EL panel 410 corresponding to the non-image display unit 103 and the substrate 411 and the encapsulation unit 415 of the organic EL panel 410 corresponding to the image display unit 102 may be exposed.

In the embodiments of the present invention, a flat display panel of an organic EL panel type has been described. However, the present invention is not limited to this and can be applied to all types of flat display panels having a two-sided emission display element.

The structures of the support member according to the embodiments of the present invention are not limited to the structures shown in FIGS. 1 through 4 and the present invention can be applied to any structure in which one side of the support member is exposed so as to withdraw a flexible printed circuit for transmitting signals from the outside and top and bottom surfaces of the organic EL panel are exposed so that light emitted from the emission light of the organic EL panel is emitted to both sides of the substrate and the encapsulation unit.

In addition, in the embodiments of the present invention, an active-matrix OELD panel has been described as an organic EL panel but the present invention is not limited to this and can be applied to a passive-matrix OELD panel and an OELD panel having a variety of cross-sectional structures other than the cross-sectional structure of FIG. 3.

In the embodiments of the present invention, the support member for supporting the flat display panel has a structure in which portions corresponding to top and bottom surfaces of the flat display panel are exposed such that the path of light emitted from the emission layer of the two-sided emission flat display panel is not interfered with and the flat display panel can be supported and protected. While the present invention has been particularly shown and described with reference to exemplary embodiments thereof, it will be understood by those of ordinary skill in the art that various modifications in form and detail can be made therein without departing from the spirit and scope of the present invention as defined by the following claims.

What is claimed is:

1. An apparatus to support a flat display panel having a display element, the apparatus comprising:
   a first support member having a first groove and adapted to support one of four sides of the flat display panel; and
   a pair of second support members each having a second groove and adapted to support opposite sides excluding the one side of the four sides of the flat display panel;
   wherein a side opposite to the one side of the four sides of the flat display panel is exposed, and wherein the flat display panel is arranged in the first groove of the first support member and the second grooves of the pair of second support members and supported by the first support member and the pair of second support members,
   wherein the first support member and the pair of second support members support the flat display panel to expose portions of the flat display panel corresponding to the display element of top and bottom surfaces of the flat display panel.

2. The apparatus of claim 1, wherein the first support member and the pair of second support members each comprise a thin metallic plate material.

3. The apparatus of claim 1, wherein the first support member and the pair of second support members are separate from one another.

4. The apparatus of claim 1, wherein the first support member and the pair of second support members comprise a unitary body.

5. The apparatus of claim 1, wherein the flat display panel comprises a two-sided emission Organic Electroluminescent Display (OELD)panel.

6. A flat panel display device, comprising:
   a display panel including a substrate having an image display unit, a display element arranged on the image display unit of the substrate, and an encapsulation unit adapted to encapsulate the display element; and
   a support member adapted to support the display panel, the support member including:
      a first support member having a first groove and adapted to support one side of four sides of the flat display panel; and
      a pair of second support members each having a second groove and adapted to support opposite sides excluding the one side of the four sides of the flat display panel;
   wherein a side opposite to the one side of the four sides of the flat display panel is exposed and wherein the flat display panel is arranged in the first groove of the first support member and the second grooves of the pair of second support members,
   wherein the first support member and the pair of second support members support the flat display panel to expose portions correspondina to the display element of top and bottom surfaces of the flat display panel.

7. The flat panel display device of claim 6, wherein the first support member and the pair of second support members each comprise a thin metallic plate material.

8. The flat panel display device of claim 7, wherein the first support member and the pair of second support members are separate from one another.

9. The flat panel display device of claim 6, wherein the first support member and the pair of second support members comprise a unitary body.

10. The flat panel display device of claim 6, wherein the display panel is a two-sided emission Organic Electroluminescent Display (OELD) panel.

11. An apparatus to support a flat display panel having a display element, the apparatus comprising:
   a first support member and a second support member, at least one of the first and second support members including a concave portion, the first and second support members being separate from each other and then combined with each other to support the flat display panel;

wherein a side opposite to the one side of four sides of the flat display panel is exposed, wherein the concave portion is a groove defined by combining the first support member and the second support member, and wherein the flat display panel is arranged in the groove, wherein the flat display panel is supported by the first and second support members to expose portions corresponding to the display element of top and bottom surfaces of the flat display panel.

12. The apparatus of claim 11, wherein the first and second support members each comprise a thin metallic plate material.

13. The apparatus of claim 11, wherein the concave portion is arranged in the first support member to support a bottom surface of the flat display panel.

14. The apparatus of claim 11, wherein the concave portion is arranged in the second support member to support a top surface of the flat display panel.

15. The apparatus of claim 11, wherein the concave portion is arranged in each of the first and second support members.

16. The apparatus of claim 11, wherein the flat display panel comprises a two-sided emission Organic Electroluminescent Display (OELD) panel.

17. A flat panel display device, comprising:
a flat display panel including a substrate having an image display unit, a display element arranged on the image display unit of the substrate, and an encapsulation unit adapted to encapsulate the display element; and
a first support member and a second support member, at least one of the first and second support members including a concave portion, a side opposite to one side of four sides of the flat display panel being exposed, the first and second support members being separate from each other and then combined to support the flat display panel;

wherein the concave portion is a groove defined by combining the first and second support members above and below, and wherein the flat display panel is arranged in the groove, wherein the flat display panel is supported by the first and second support members to expose portions corresponding to the display element of top and bottom surfaces of the flat display panel.

18. The flat panel display device of claim 17, wherein the first and second support members each comprise a thin metallic plate material.

19. The flat panel display device of claim 17, wherein the concave portion is arranged in the first support member to support a bottom surface of the flat display panel.

20. The flat panel display device of claim 17, wherein the concave portion is arranged in the second support member to support a top surface of the flat display panel.

21. The flat panel display device of claim 17, wherein the concave portion is arranged in each of the first and second support members.

22. The flat panel display device of claim 17, wherein the flat display panel comprises a two-sided emission Organic Electroluminescent Display (OELD) panel.

* * * * *